United States Patent [19]

Ogura et al.

[11] Patent Number: 5,228,091
[45] Date of Patent: Jul. 13, 1993

[54] LOUDNESS CONTROL CIRCUIT FOR SELECTIVELY EMPHASIZING BOTH HIGH FREQUENCY AND LOW FREQUENCY COMPONENTS

[75] Inventors: Shinichi Ogura; Nozomu Nagashima; Shigeru Munetomo; Shuichi Horie; Hideaki Kobayashi; Satoshi Sekine, all of Saitama, Japan

[73] Assignee: Pioneer Electronic Corporation, Tokyo, Japan

[21] Appl. No.: 871,808

[22] Filed: Apr. 22, 1992

[30] Foreign Application Priority Data

Oct. 31, 1991 [JP] Japan ................. 3-286015

[51] Int. Cl.⁵ ..................... H03G 3/00; H04B 1/06
[52] U.S. Cl. ............................ 381/104; 455/267
[58] Field of Search ............ 381/104, 109, 102, 55; 455/267, 268, 200.1

[56] References Cited

U.S. PATENT DOCUMENTS 4,320,534 3/1982 Sakai et al. .................. 455/267

Primary Examiner—Jin F. Ng
Assistant Examiner—Ping Wong
Attorney, Agent, or Firm—Finnegan, Henderson, Farabow, Garrett & Dunner

[57] ABSTRACT

A loudness control circuit having a sound volume adjusting variable resistor with a center tap is provided. The loudness control circuit has a buffer circuit of low output impedance having an input terminal to which a sound signal is applied through a high frequency coupling capacitor. The output terminal of the buffer circuit is connected through a series circuit of a low frequency blocking capacitor, a protective resistor and a shunt resistor to the center tap of the sound volume adjusting variable resistor. The connecting point of the protective resistor and the shunt resistor is grounded through an electronic switching element. The electronic switching element is turned on and off for the on-off control of loudness.

15 Claims, 4 Drawing Sheets

LOUDNESS CONTROL CIRCUIT FOR SELECTIVELY EMPHASIZING BOTH HIGH FREQUENCY AND LOW FREQUENCY COMPONENTS

BACKGROUND OF THE INVENTION

This invention relates to a loudness control circuit in which, when the loudness of an input sound signal is low, the high frequency components and the low frequency components of the sound signal are increased in sound pressure, in order to compensate the frequency characteristic heard by a listener.

The frequency characteristic of sound which is audible to the human ear depends on the volume of the sound. As the volume of the sound decreases, it becomes difficult for a person to hear the low frequency components and the high frequency components of the sound. In order to solve this problem, acoustic devices such as stereophonic sound reproducing devices are provided with a loudness control circuit.

An example of a conventional loudness control circuit of this type is shown in FIG. 4. The circuit of FIG. 4 comprises a sound volume adjusting variable resistor 1 with center tap T (which divides the variable resistor into upper part 1a and lower part 1b), a high frequency bypassing capacitor 2, low frequency blocking capacitor 3, shunt resistor 4, and loudness switch 5. Loudness switch 5, together with other switches, is mounted on the operating panel of an acoustic device such as a stereophonic sound reproducing device.

In the loudness control circuit shown in FIG. 4, the sound volume of the output signal is controlled (increased or decreased) by sliding slider 1c of sound volume adjusting variable resistor 1. The loudness of the output signal is controlled by operating loudness switch 5. When loudness switch 5 is set to ON, the high frequency components of the input sound signal pass through high frequency range bypassing capacitor 2 and are applied to lower part 1b of variable resistor 1, thus being emphasized. On the other hand, although the low frequency components of the input sound signal tend to flow through the upper part 1a of the variable resistor 1 to the shunt resistor 4, they are blocked by the low frequency blocking capacitor 3. As a result, the low frequency components flow in lower part 1b of the variable resistor 1, thus being emphasized. Therefore, the sound reproduced is less attenuated both in high frequency range and in low frequency range as shown in FIG. 5, which illustrates the loudness effect provided by the loudness control circuit.

In the loudness control circuit, loudness switch 5 is a mechanical switch, while capacitors 2 and 3 and resistor 4 are provided on a printed circuit board. Hence, signal lines in which a sound signal flows must be connected between the contacts of loudness switch 5, capacitors 2 and 3, and resistor 4. This may lower the S/N ratio of the signal.

This difficulty may be eliminated by the following method. As shown in FIG. 6, the contacts of loudness switch 5 are replaced with electronic switching elements α and β such as transistors or field-effect transistors. These electronic switching elements are arranged on the same printed circuit board with capacitors 2 and 3 and resistor 4 so that they are connected to the latter with the shortest conductors. In this circuit, only the means for providing on and off control signals for the electronic switching elements are installed on the operating panel.

FIG. 7 shows a transistor employed as the electronic switching element α. In a loudness "on" operation (with the loudness switch turned on), it is necessary to cause a DC bias current to flow between the base and the emitter of the transistor to render the latter conductive. The DC bias current is not related to the sound signal at all. This DC bias current flows in the sound volume adjusting variable resistor 1, thus lowering the S/N ratio of the sound signal. Furthermore, the switching operation for application of the bias current may result in the production of transient noises.

In order to eliminate these difficulties, the following methods are employed. In one method, shown in FIG. 8, only the electronic switching element β for low frequency components is replaced with a transistor or the like. The electronic switching element α for high frequency components is eliminated and high frequency bypassing capacitor 2 is connected directly to center tap T of variable resistor 1, which may lower the S/N ratio. In another method, shown in FIG. 9, both high frequency bypassing capacitor 2 and electronic switching element α are eliminated, and only the electronic switching element β for low frequency components is replaced with a transistor or the like.

However, these circuits are still disadvantageous in the following respects. In the circuit shown in FIG. 8, the high frequency bypassing capacitor 2 is fixedly connected. Therefore, whether the loudness switch is turned on or off, the high frequency components are emphasized in loudness at all times. In the case of the circuit shown in FIG. 9, the high frequency bypassing capacitor 2 is eliminated, and therefore the high frequency components cannot be emphasized in loudness.

SUMMARY OF THE INVENTION

Accordingly, an object of this invention is to eliminate the above-described difficulties accompanying a conventional loudness control circuit.

More specifically, an object of the invention is to provide a loudness control circuit, which is made up of electronic means, to emphasize both high frequency components and low frequency components in loudness.

The foregoing object and other objects of the invention have been achieved by the provision of a loudness control circuit having a sound volume adjusting variable resistor with a center tap, which, according to the invention, comprises: buffer means of low output impedance, an input terminal of the buffer means to which a sound signal is applied through a high frequency coupling capacitor, an output terminal of the buffer means connected through a series circuit of a low frequency blocking capacitor, a protective resistor and a shunt resistor to the center tap of the sound volume adjusting variable resistor, and an electronic switching element through which the connecting point of the protective resistor and the shunt resistor is grounded, the electronic switching element being operated on and off for loudness on-off control.

When the electronic switching element is turned off, the high frequency components of the input sound signal are applied through the high frequency coupling capacitor and the buffer means to the center tap of the sound volume adjusting variable resistor. At the same time, the low frequency components of the input sound signal which tend to go through the variable resistor to the shunt resistor are blocked by the low frequency blocking capacitor. As a result, the low frequency components flow in the lower part of the sound volume adjusting variable resistor. Thus, both the high frequency components and the low frequency components of the sound signal are emphasized.

The nature, utility and principle of the invention will be more clearly understood from the following detailed description and the appended claim when read in conjunction with the accompanying drawings.

DETAILED DESCRIPTION OF THE INVENTION

Preferred embodiments of this invention will be described with reference to the accompanying drawings.

Figure 4:
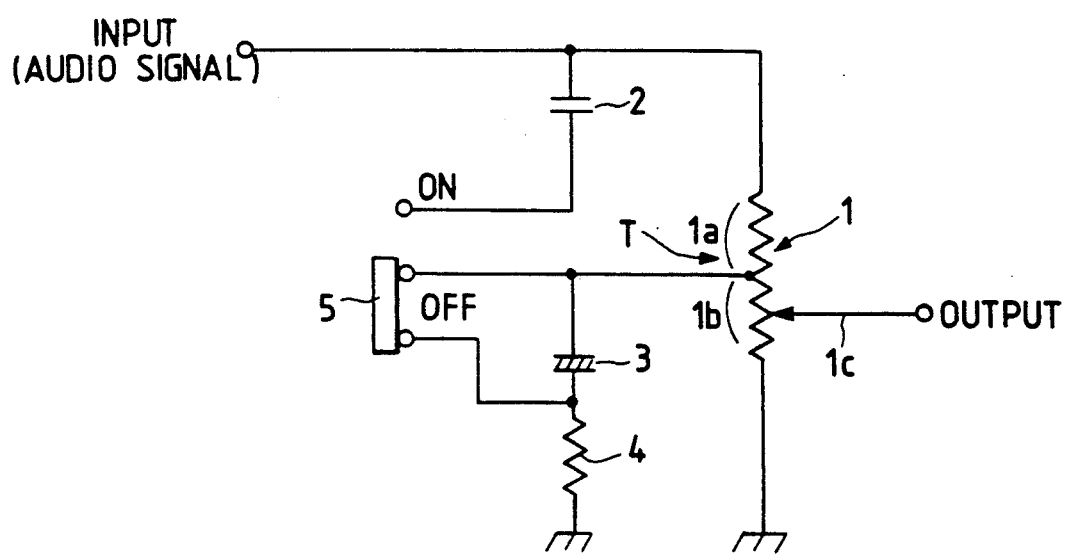
FIG. 4 is a circuit diagram showing an example of a conventional loudness control circuit.
Figure 5:
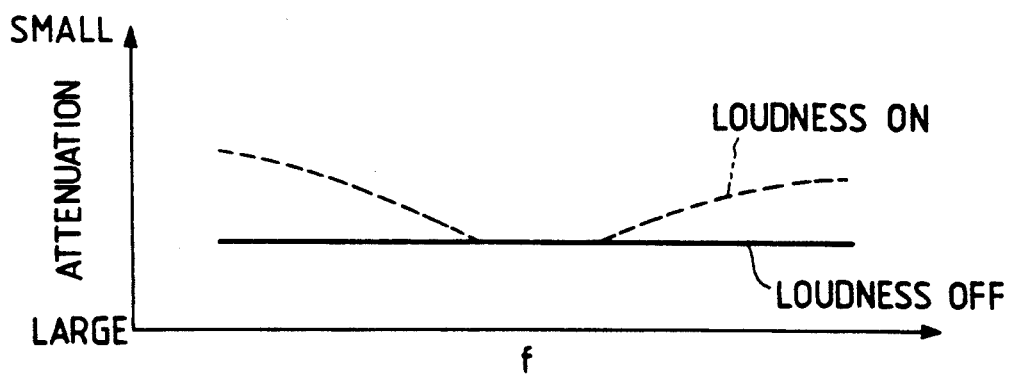
FIG. 5 is a graphical representation of the frequency characteristic of the sound signal in a loudness "on" operation and that in a loudness "off" operation.
Figure 6:
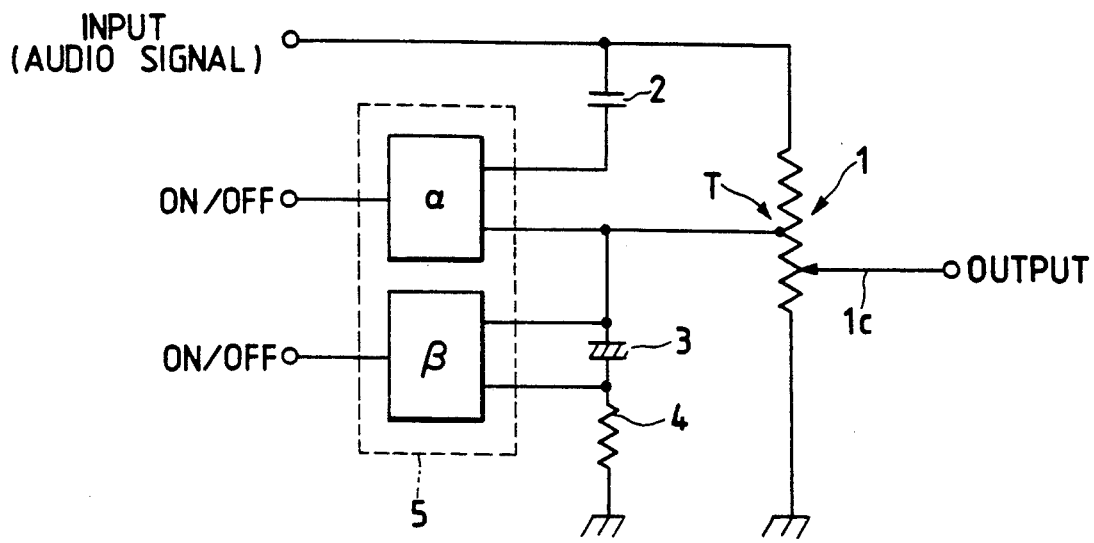
FIG. 6 is a circuit diagram of a proposed loudness control circuit formed with electronic devices.
Figure 7:
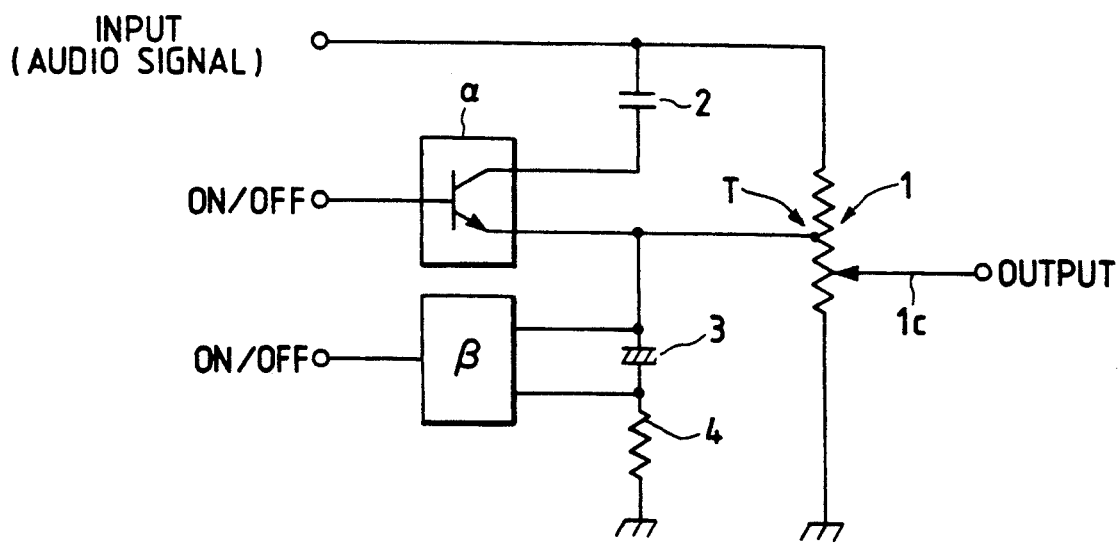
FIG. 7 is a circuit diagram for illustrating difficulties accompanying the proposed circuit shown in FIG. 6.
Figure 8:
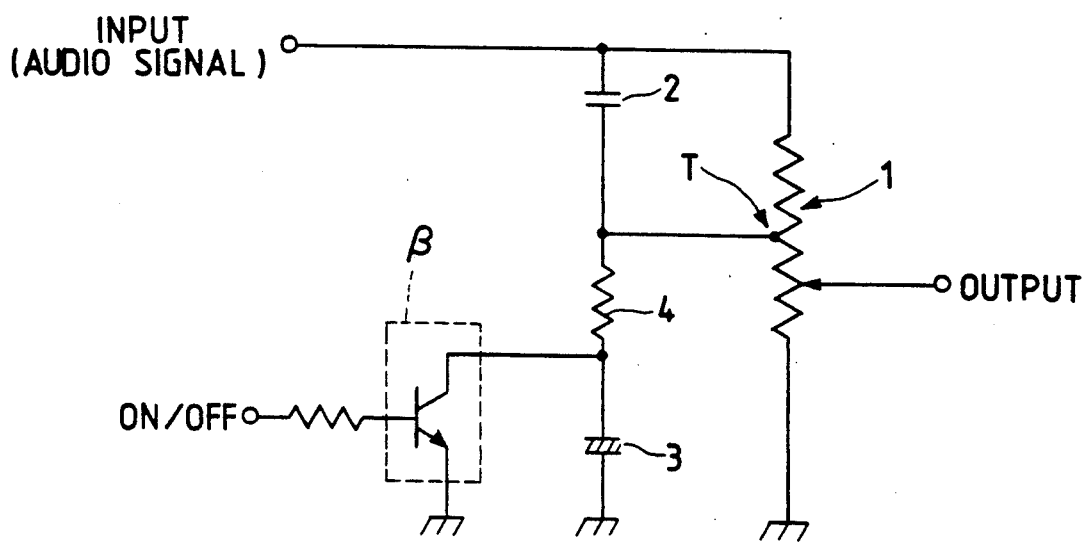
FIGS. 8 and 9 are circuit diagrams showing proposed variations of the loudness control circuit of FIG. 6.
Figure 9:
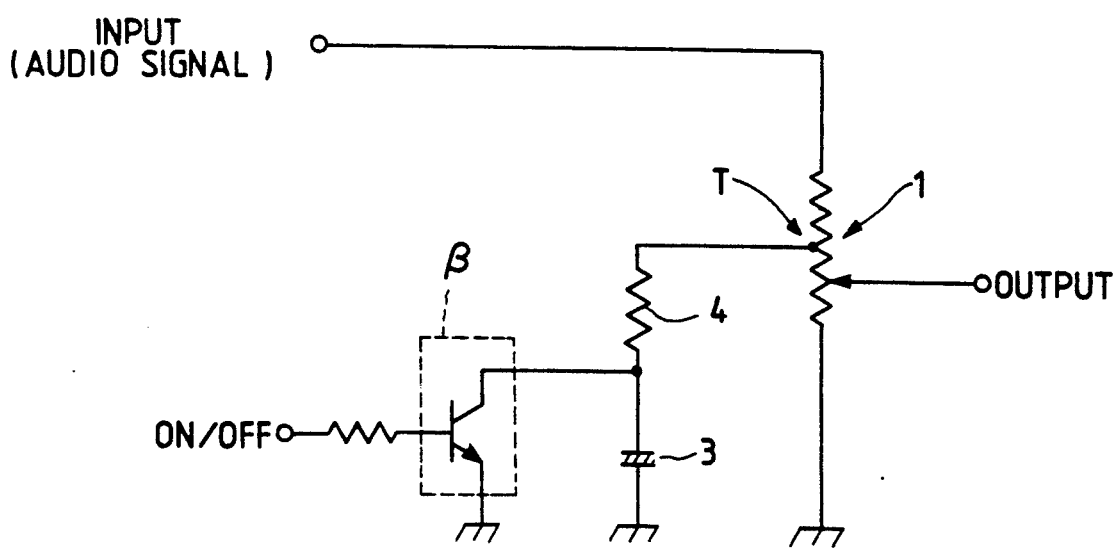

A loudness control circuit according to a first embodiment of this invention will be described with reference to FIG. 1, in which parts corresponding functionally to those which have been already described with reference to FIG. 4 are therefore designated by the same reference numerals or characters.

Figure 1:
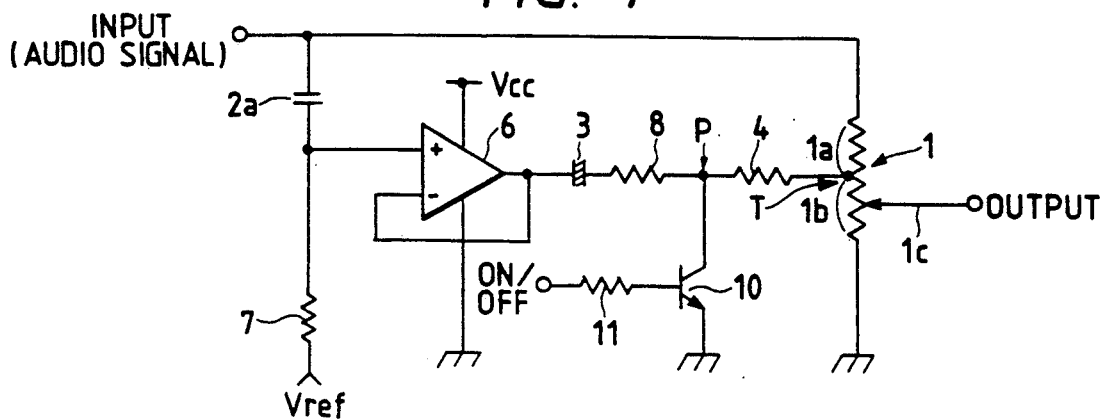
FIG. 1 is a circuit diagram showing a loudness control circuit according to a first embodiment of the invention.

In FIG. 1, reference numeral 6 designates a voltage follower comprising an operational amplifier. Voltage follower 6 is a buffer amplifier which substantially has an amplification factor of one, is infinite in input impedance, and zero in output impedance. A bias voltage Vref is applied through bias resistor 7 to an input terminal of voltage follower 6, to which a sound signal is applied through high frequency coupling capacitor 2a. The output terminal of voltage follower 6 is connected through low frequency blocking capacitor 3, protective resistor 8 and shunt resistor 4 to center tap T of sound volume adjusting variable resistor 1. Switching transistor 10 is connected between connecting point P of protective resistor 8 and shunt resistor 4 and ground. Protective resistor 8 limits the output current of voltage follower 6 when transistor 10 is rendered conductive in order to protect the circuit.

For a loudness "off" operation, an "H" (high level) signal is applied to the base of transistor 10, rendering transistor 10 conductive (on) and grounding connecting point P. That is, shunt resistor 4 is connected in parallel to lower part 1b of variable resistor 1. This operation is equivalent to the operation in FIG. 4 in which loudness switch 5 is set to "off".

For a loudness "on" operation, an "L" (low level) signal is applied to the base of transistor 10, so that the transistor is rendered nonconductive, electrically disconnecting connecting point P from ground. As a result, high frequency components of the sound signal applied through high frequency coupling capacitor 2a to voltage follower 6 are applied through low frequency blocking capacitor 3, protective resistor 8 and shunt resistor 4 to lower part 1b of variable resistor 1, thus emphasizing the high frequency components of the sound signal.

At the same time, low frequency blocking capacitor 3, which had previously been grounded through transistor 10, is made active. Hence, in the loudness "on" operation, the impedance of a series circuit of low frequency blocking capacitor 3, protective capacitor 8 and shunt resistor 4 is connected between center tap T of variable resistor 1 and ground, since the left terminal of the low frequency blocking capacitor 3 can be regarded as grounded to alternating current because, as was described before, the output impedance of the operational amplifier 6 can be regarded as zero. In contrast, in the loudness "off" operation, only shunt resistor 4 is connected as impedance between center tap T and ground.

As a result, the combined impedance of lower part 1b of sound volume adjusting variable resistor 1 and the above-described series connection of low frequency blocking capacitor 3, protective capacitor 8 and shunt resistor 4 in the loudness "on" operation is larger than the combined impedance of lower part 1b of sound volume adjusting variable resistor 1 and shunt resistor 4 in the loudness "off" operation. The larger impedance in the loudness "on" operation is more effective in blocking low frequency components than the smaller impedance in the loudness "off" operation. As a result, the voltage division ratio provided by upper part 1a of the variable resistor 1 and the composite impedance is higher for low frequency components in the loudness "on" operation than in the loudness "off" operation, thus emphasizing the low frequency components of the input signal during the loudness "on" operation.

With the loudness control circuit shown in FIG. 1, the loudness on-off control can be achieved merely by turning on and off the transistor 10. It is unnecessary to extend the signal lines to the operating panel.

Figure 2:
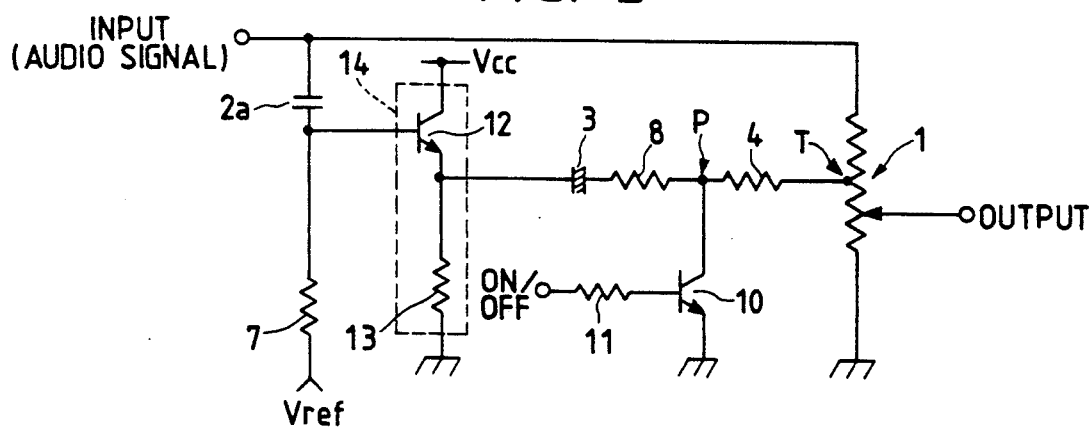
FIG. 2 is a circuit diagram showing a loudness control circuit according to a second embodiment of the invention.

FIG. 2 shows a loudness control circuit according to a second embodiment of the invention. As is apparent from comparison of FIG. 2 with FIG. 1, the second embodiment is obtained by replacing voltage follower 6 in the first embodiment (FIG. 1) with emitter follower 14 comprising transistor 12 and emitter resistor 13. The operation of the second embodiment is similar to that of the first embodiment shown in FIG. 1.

Figure 3:
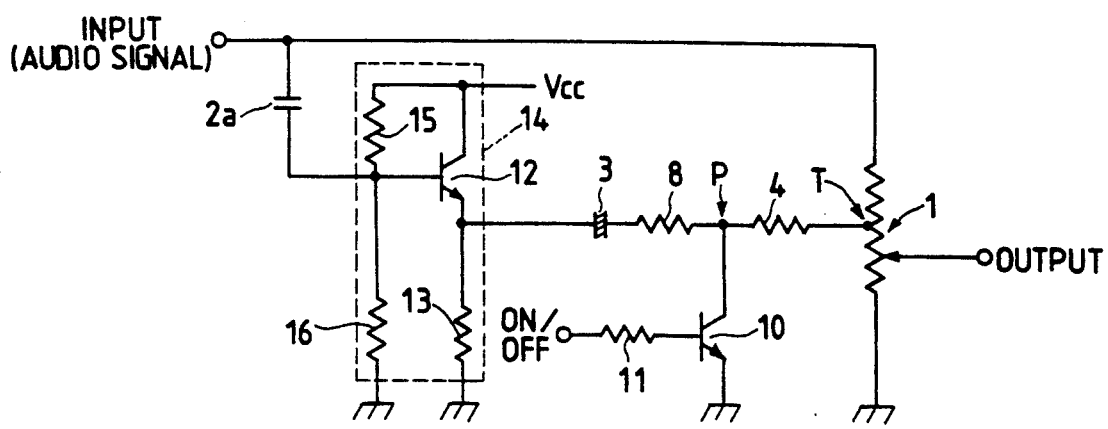
FIG. 3 is a circuit diagram showing a loudness control circuit according to a third embodiment of the invention.

FIG. 3 shows a loudness control circuit according to a third embodiment of the invention. The third embodiment can be obtained by modifying the second embodiment (FIG. 2) in such a manner that a bias voltage applied to the base of transistor 12 (FIG. 2) is provided by bleeder resistors 15 and 16. The operation of the third embodiment is similar to that of the first embodiment shown in FIG. 1.

As is apparent from the above description, in the loudness control circuit of the invention it is unnecessary to extend the signal lines to the operating panel, and thus the loudness on-off control can be achieved merely by operating the electronic switching element on and off. Thus, the loudness control circuit of the invention prevents a decrease in the S/N ratio of the sound signal and allows the loudness of the high frequency components and the low frequency components to be controlled.

While the invention has been described in connection with the preferred embodiments shown herein, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A loudness control circuit having a sound volume adjusting variable resistor with a center tap, comprising:
   an input terminal to which a sound signal is applied;
   a high frequency coupling capacitor having a first end connected to said input terminal;
   a buffer circuit having a low output impedance, said buffer circuit having an input connected to a second end of said high frequency coupling capacitor;
   a low frequency blocking capacitor, a protective resistor, and a shunt resistor connected in series between an output of said buffer circuit and the center tap of said sound volume adjusting variable resistor;
   an electronic switching element having a first end connected to a connecting point of said protective resistor and said shunt resistor and a second end connected to ground;
   wherein a loudness control of said loudness control circuit is turned on and off by said electronic switching element.

2. A loudness control circuit according to claim 1, wherein said buffer circuit comprises a voltage follower having an amplification factor of approximately 1, a substantially infinite input impedance, and approximately zero output impedance.

3. A loudness control circuit according to claim 1, wherein said buffer circuit comprises an emitter follower having a transistor and an emitter resistor.

4. A loudness control circuit according to claim 1, wherein said buffer circuit comprises a voltage source, an emitter follower connected to said voltage source, a first bleeder resistor connected between said voltage source and a base of said emitter follower, and a second bleeder resistor connected between said base of said emitter follower and ground.

5. A loudness control circuit according to claim 1, wherein said switching element is a bipolar transistor having a terminal connected to a base of said bipolar transistor for switching said bipolar transistor on and off.

6. A loudness control circuit according to claim 1, wherein said input terminal is also connected to a first end of said sound volume adjusting variable resistor.

7. A loudness control circuit having a sound volume adjusting variable resistor with a first end, a second end, and a center tap, comprising:
   an input terminal for receiving a sound signal;
   high frequency coupling capacitor means, connected to said input terminal, for passing high frequency components of said sound signal;
   buffer means, having a low output impedance, for receiving high frequency components of said sound signal from said high frequency coupling capacitor means at an input of said buffer means and providing said high frequency components at an output of said buffer means;
   low frequency blocking capacitor means, connected to said output of said buffer means, for blocking transmission of low frequency components from said center tap;
   a protective resistor connected to said low frequency blocking capacitor means;
   a shunt resistor connected between said protective resistor and said center tap;
   switching means, having a first end connected to a point between said protective resistor and said shunt resistor and a second end connected to ground, for grounding said shunt resistor and said low frequency blocking capacitor means when said switching means is switched on.

8. A loudness control circuit according to claim 7, wherein said switching means allows said high frequency components to pass from said output of said buffer means to said center tap, and blocks transmission of said low frequency components from said center tap when said switching means is off, thereby turning on a loudness control of said loudness control circuit.

9. A loudness control circuit according to claim 7, wherein said switching means prevents said high frequency components from passing from said output of said buffer means to said center tap, and allows the transmission of said low frequency components from said center tap through said shunt resistor to ground when said switching means is on, thereby turning off a loudness control of said loudness control circuit.

10. A loudness control circuit according to claim 7, wherein said low frequency blocking capacitor means, said protective resistor, and said shunt resistor are connected in series.

11. A loudness control circuit according to claim 7, wherein said switching means comprises a bipolar transistor having a terminal connected to a base of said bipolar transistor for switching said bipolar transistor on and off.

12. A loudness control circuit according to claim 7, wherein said buffer means comprises a voltage follower having an amplification factor of approximately 1, a substantially infinite input impedance, and approximately zero output impedance.

13. A loudness control circuit according to claim 7, wherein said buffer means comprises an emitter follower having a transistor and an emitter resistor.

14. A loudness control circuit according to claim 7, wherein said buffer means comprises a voltage source, an emitter follower connected to said voltage source, a first bleeder resistor connected between said voltage source and a base of said emitter follower, and a second bleeder resistor connected between said base of said emitter follower and ground.

15. A loudness control circuit according to claim 7, wherein said input terminal is also connected to a first end of said sound volume adjusting variable resistor.

* * * * *